United States Patent [19]
Dao et al.

[11] Patent Number: 5,688,409
[45] Date of Patent: Nov. 18, 1997

[54] PROCESSES FOR FABRICATING DEVICE LAYERS WITH ULTRAFINE FEATURES

[75] Inventors: Giang T. Dao, Fremont; Joseph C. Langston, Los Altos, both of Calif.

[73] Assignee: Intel Corporation, Santa Clara, Calif.

[21] Appl. No.: 667,445

[22] Filed: Jun. 21, 1996

[51] Int. Cl.$^6$ ................................................. G03F 7/00
[52] U.S. Cl. ................................. 216/48; 430/5; 430/396
[58] Field of Search ........................... 430/5, 394, 396; 216/48

[56] References Cited

U.S. PATENT DOCUMENTS

| | | | |
|---|---|---|---|
| 5,300,379 | 4/1994 | Dao et al. | 430/5 |
| 5,354,632 | 10/1994 | Dao et al. | 430/5 |
| 5,387,485 | 2/1995 | Sukegawa et al. | 430/5 |
| 5,455,144 | 10/1995 | Okamoto et al. | 430/313 |
| 5,527,647 | 6/1996 | Doi et al. | 430/5 |

Primary Examiner—R. Bruce Breneman
Assistant Examiner—Michael E. Adjodha
Attorney, Agent, or Firm—Blakely, Sokoloff, Taylor & Zafman

[57] ABSTRACT

A new process and an improved process for fabricating device layers with ultrafine features. In one embodiment a device layer to be patterned is deposited above a substrate and a photoresist layer is deposited above that device layer. A reticle having a first transparent layer and a second opaque layer is used to pattern the photoresist layer. The reticle includes a first region with a first phase and a second region with a second phase such that the incident radiation is shifted when passing through the reticle. The second reticle layer is disposed above the first reticle layer and proximate to the location where the first region transitions to the second region of the first reticle layer. A stepper is used to expose the photoresist to radiation through the reticle. The critical dimensions of the device layer being patterned are controlled by adjusting the partial coherence of the stepper during exposure.

21 Claims, 6 Drawing Sheets

PROCESSES FOR FABRICATING DEVICE LAYERS WITH ULTRAFINE FEATURES

BACKGROUND OF THE INVENTION

1. Field of the Invention

This invention relates to the field of semiconductor device fabrication, and more specifically, to processes for fabricating device layers with ultrafine features.

2. Background Information

As semiconductor devices become smaller, the features (or components) of those devices decrease and the density of those features increase. Therefore, it has become increasingly more important to control the critical dimensions of these features. However, as the dimensions of semiconductor device features become smaller and spaced relatively closer, for example less than 0.5 micron (<0.5µ) and even less than or about 0.25 micron ($\leq 0.25\mu$), the processes used to fabricate such features become less reliable and are unable to control the critical dimensions (CDs) of those features. If the critical dimensions of such features are not controlled, some of the features may be shorted together, isolated, or etc. and consequently the semiconductor device may not be electrically reliable. Thus, new methods for fabricating and patterning device layers with ultrafine features are needed.

Device layers on a semiconductor substrate are patterned by placing photosensitive materials on the substrate and exposing these photosensitive materials (resists) to radiation. The resist is exposed to radiation which passes through a reticle (or mask) having patterns thereon, and these patterns within the mask are subsequently transferred to the resist. The resist is then developed and the soluble portions are removed, thereby exposing the device layer underneath the resist layer. The device layer is then etched where the resist has been removed, thus patterning the device layer. It should be noted that although patterning with respect to a positive resist is described, a negative resist may also be used.

Reticles, as described above, have patterns thereon which are transferred to the resist in order to pattern the device layer (or layers) underlying the resist. Typically, a reticle comprises opaque regions and transparent regions. During device fabrication, the reticle is placed over a resist and incident radiation is provided to the reticle. Incident radiation is provided for example, by a stepper. The transparent regions allow the radiation to pass through to the resist and the opaque regions block out the incident radiation. For one prior art mask design, the opaque regions are made of chrome, deposited on a quartz reticle. Open regions in the chrome comprise transparent quartz regions that transmit the incident radiation.

In an effort to reduce feature sizes in semiconductor integrated circuits, prior art methods of phase-shifting the incident radiation have been developed. One type of phase-shifting reticle employs transparent "phase regions" that transmit some or all of the incident radiation. The phase regions are positioned proximate to openings on the reticle that are used to define device features. The phase region shifts the incident radiation approximately 180° relative to the 0° regions, or feature openings. The radiation transmitted through the phase region thus destructively interferes with diffracted radiation from the edge of the feature opening, providing good contrast at the boundary of the feature.

Another prior art method of phase-shifting, called phase-edge, is used to create "ultrafine" features, having very small dimensions, on a semiconductor substrate. FIGS. 1a–1c illustrate the phase-edge method. FIG. 1a includes a quartz reticle 100 containing a first phase region 111 and a second phase region 112. Both of the phase regions 111 and 112 are substantially transparent, and thus will transmit incident radiation. However, the thickness of the second phase region 112 has been changed by a quartz etching process known in the art. The difference in thickness allows phase region 112 to shift incident radiation by 180° relative to phase region 111. A phase-shifting region 112 may also be created by adding a thickness of transmitting material to the quartz reticle in order to make a phase region.

FIG. 1b illustrates a profile of the intensity of radiation, at the surface of a semiconductor substrate, after the radiation is transmitted through each of the phase regions 111 and 112. Note that the intensity of radiation transmitted by each phase region has a magnitude of approximately 1, whereas the intensity drops to approximately 0 at point 123, corresponding to the edge 113 between the two regions. The sharp drop in intensity at point 123 is due to the destructive interference of radiation that occurs between the two phase regions 111 and 112. Thus, when a photosensitive material is exposed to radiation through reticle 100, a portion of the material beneath edge 113 will be substantially unexposed, while portions of the material beneath regions 111 and 112 will be substantially exposed. When, for example, a positive photoresist is exposed and developed using reticle 100, an ultrafine strip of photoresist 131 will remain beneath edge 113, as illustrated in FIG. 1c. The ultrafine features produced by this phase-edge technique have shown a resolution of as low as approximately 100 nanometers.

One variation on the phase-edge technique uses a mask with a strip of opaque material, such as chrome, placed between the 180° and 0° regions. This method of combining phase-edge with chrome has an advantage over the standard phase-edge technique described above. The width of the chrome strip on the phase-edge mask may be deliberately varied in order to produce gate features of varying widths.

FIGS. 2a–2c illustrate the phase-edge with chrome method. FIG. 2a includes a quartz reticle 200 containing a first phase region 211 and a second phase region 212. Both of the phase regions 211 and 212 are substantially transparent, and thus will transmit incident radiation. However, as described above in the discussion of the phase-edge method, the thickness of the second phase region 212 has been changed by a quartz etching process known in the art. In the phase-edge with chrome method reticle 200 includes a strip of opaque material 215, for example chrome, to produce a gate feature with a larger width.

FIG. 2b illustrates a profile of the intensity of radiation, at the surface of a semiconductor substrate, after the radiation is transmitted through each of the phase regions 211 and 212 with blocking material 215. The intensity of radiation transmitted by each phase region has a magnitude of approximately 1, whereas the intensity drops to approximately 0 in the region 223, corresponding to the edge 213 between the two regions and blocking material 215. The sharp drop in intensity in region 223 is due to the destructive interference of radiation that occurs between the two phase regions 211 and 212 and the blocked radiation in the region 215. Thus, when a photosensitive material is exposed to radiation through reticle 200, a portion of the material beneath edge 213 and blocking material 215 will be substantially unexposed, while portions of the material beneath regions 211 and 212 without blocking material 215 will be substantially exposed. When, for example, a positive photoresist is exposed and developed using reticle 200, an ultrafine strip of photoresist 231 will remain beneath edge 213 and blocking material 215, as illustrated in FIG. 2c.

Phase-edge and phase-edge with chrome processes typically require at least two reticles. The first reticle, such as the phase-edge reticle shown in FIG. 1a, defines the ultrafine features to be created. Because an ultrafine feature line is created at each transition between an 180° and 0° border, it is impossible to create only one single line. For example, assume the phase region 112 of FIG. 1a is shaped as a square and is a 180° region. Assume further that the outlying regions surrounding the phase region 112 are 0°. Ultrafine features will thus be produced along edge 113 and along the other three edges of the phase region 112. A phase-edge with chrome process, shown in FIG. 2a, employing a chrome strip 215 along edge 213 would have the same problem. Loops or closed polygon structures are therefore formed using the first mask of the phase-edge and phase-edge with chrome techniques.

A second mask may be used to eliminate the unwanted portions of lines that are created during the exposure using the first mask. The second mask may comprise device features that are defined by opaque and transparent regions on the mask in order to preserve the desired features and eliminate the unwanted features. For example, the second mask to accompany mask 100 of FIG. 1a may include a chrome line at a location over the desired portion of feature 131, with transparent openings elsewhere. Using a positive photosensitive layer, only the desired ultrafine line would remain.

One problem associated with the phase-edge technique is that the phase-edge can only pattern a single critical dimension. Device layers in current semiconductor devices require patterning with varying critical dimensions. The phase-edge with chrome technique solves this problem with respect to larger critical dimensions, for example approximately 1μ. However, when a device layer requires patterning to small critical dimensions, for example submicron dimensions of less than or about 0.25μ, the phase-edge with chrome technique fails because it is impossible and impractical with current fabrication processes to form a small enough chrome strip that will provide such submicron dimensions with any accuracy.

Thus, what is needed is a technique (or process) for fabricating device layers with ultrafine features that has the ability to pattern features with a variety of critical dimensions.

SUMMARY OF THE INVENTION

A method for fabricating a device layer with ultrafine features is described. A first device layer to be patterned is deposited above a substrate and a photoresist layer is deposited above that first device layer. A reticle having a first transparent layer and a second opaque layer is used to pattern the photoresist layer. The reticle includes a first region with a first phase and a second region with a second phase such that the incident radiation is shifted when passing through the reticle. The second reticle layer is disposed above the first reticle layer and proximate to the location where the first region transitions to the second region of the first reticle layer. A stepper is used to expose the photoresist to radiation through the reticle. The critical dimensions of the first device layer being patterned are controlled by adjusting the partial coherence of the stepper during exposure.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which:

FIG. 1b is a plot of the intensity of radiation transmitted through the reticle of FIG. 1a.

FIG. 2b is a plot of the intensity of radiation transmitted through the reticle of FIG. 2a.

DETAILED DESCRIPTION

A new process and an improved process for fabricating device layers with ultrafine features are disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes new processes for patterning device layers with ultrafine features that have the ability to form device layers with a full range of critical dimensions (CDs) (i.e. from small/submicron CDs to large CDs). The following discussion of the present invention describes the patterning of gate electrodes in semiconductor devices. However, it will be obvious to one with ordinary skill in the art that such a discussion is merely illustrative and that the methods of the present invention may also be used to pattern other semiconductor device layers and features.

Figure 1A:
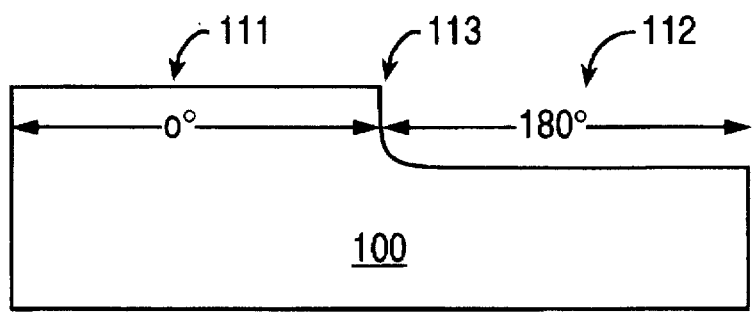
FIG. 1a illustrates a phase-edge phase-shifting reticle.
Figure 1B:
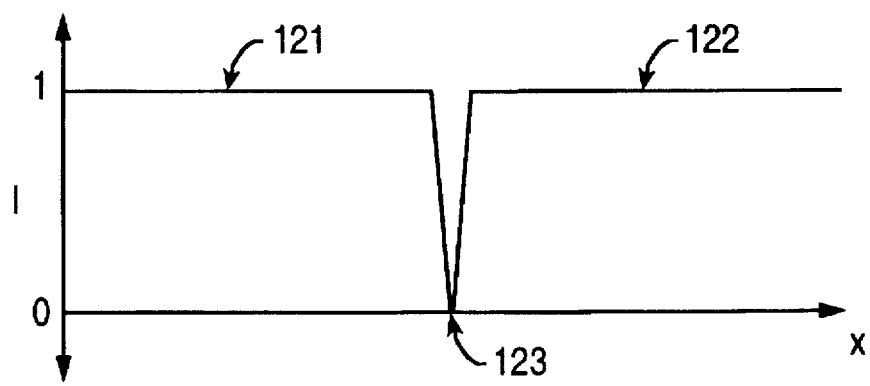
Figure 1C:
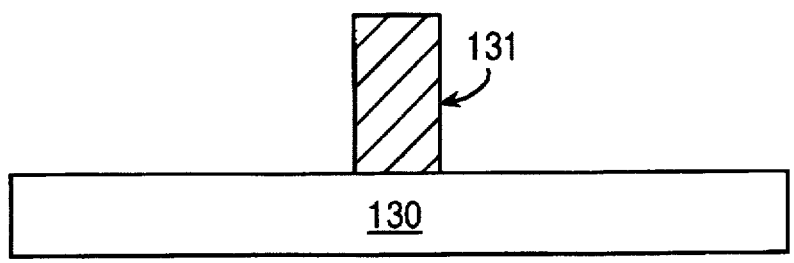
FIG. 1c illustrates a cross-section of a semiconductor substrate including a phase-edge feature.
Figure 2A:
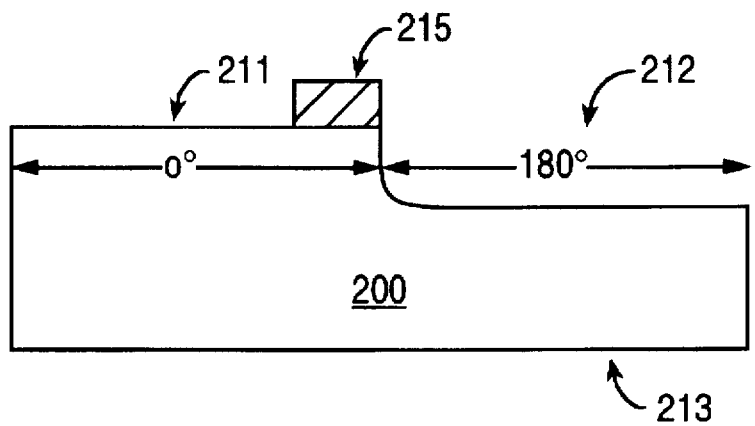
FIG. 2a illustrates a phase-edge with chrome phase-shifting reticle.
Figure 2B:
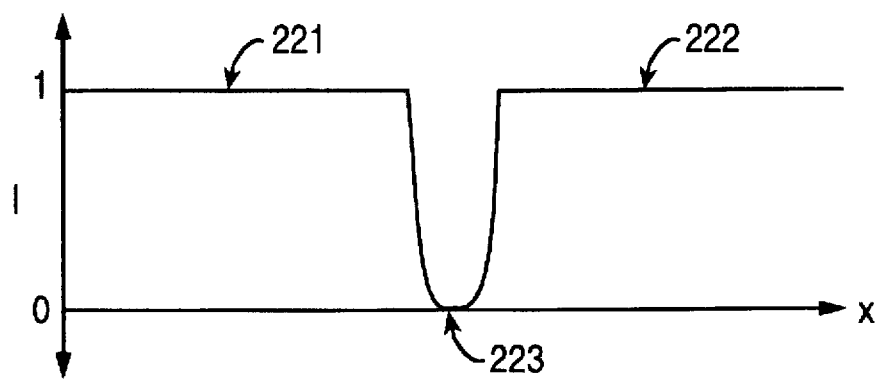
Figure 2C:
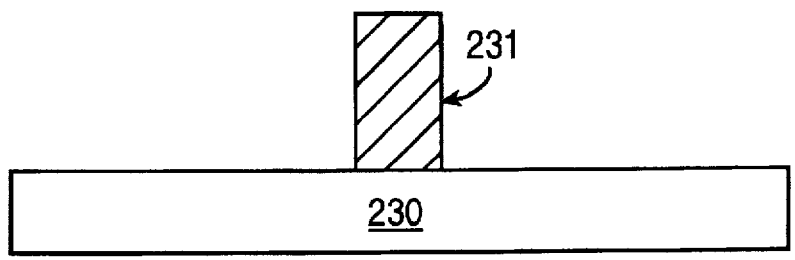
FIG. 2c illustrates a cross-section of a semiconductor substrate including a phase-edge with chrome feature.

One method for varying the CD of the device layer, for example a gate electrode, is referred to herein as the "proximity-of-edges" method. The proximity-of-edges method is an improvement upon the phase-edge and phase-shifting techniques. Rather than using a single edge to pattern a device layer as illustrated in FIGS. 1a and 2a, the proximity-of-edges technique uses two edges with a relatively close proximity to define the critical dimension of a device feature. By changing the proximity of the two edges (i.e. the distance between the two edges) the CD of the gate electrode may be varied. FIGS. 3a–3e illustrate the proximity-of-edges method.

Figure 3A:
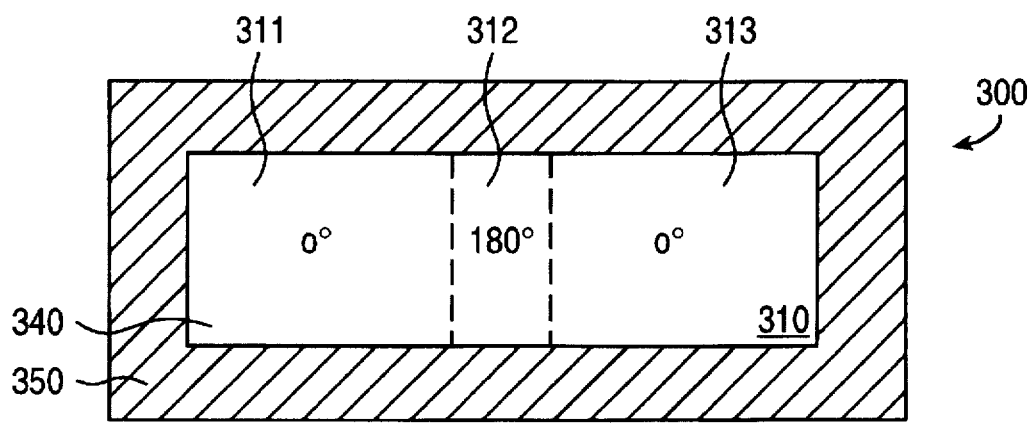
FIG. 3a illustrates a top view of a reticle used in one preferred embodiment of the proximity-of-edges method.
Figure 3B:
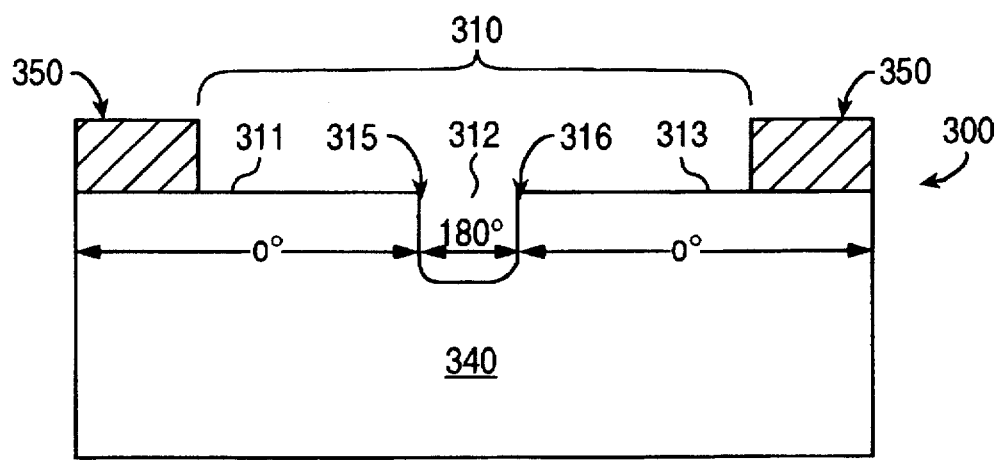
FIG. 3b illustrates a cross-sectional view of the reticle shown in FIG. 3a as used in one preferred embodiment of the proximity-of-edges method.

FIG. 3a illustrates a top view of reticle 300 having two layers, a first (or bottom) reticle layer 340 which is made of a transparent material, for example quartz, and a second (or top) reticle layer 350 which is made of an opaque material, for example chrome (chromium oxide). Diffusion region 310 is the exposed area of quartz layer 340 (i.e. is not covered by chrome layer 350) and is divided into a first phase region 311, a second phase region 312, and a third phase region 313. First and third phase regions 311 and 313, respectively, have a first phase and second phase region 312 has a second phase. In one currently preferred embodiment the difference between the first phase and the second phase is approximately 180°. A cross-sectional view of reticle 300 is shown in FIG. 3b.

Phase regions on the reticle are referred to as 0° and 180° phase regions. It should be appreciated that the actual phase of the radiation transmitted through the 0° region of the reticle may be any nominal value, and the 180° phase region merely shifts incident radiation by approximately ±180° from that nominal value. Moreover, the phase-shift between the first and second phase regions and the phase-shift between the second and third phase regions need not be 180° in order to be effective, the difference may be anywhere between approximately 160° to 200°. However, when the phase difference between any of the phase regions is as close as possible to 180°, the destructive interference between the phase regions is maximized. It should additionally be noted that 360° or a multiple thereof can be added or subtracted from any phase referred to and the result will be the same.

Figure 3C:
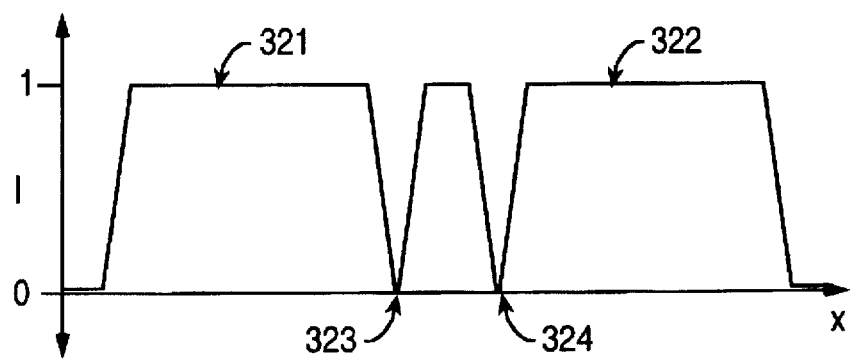
FIG. 3c is a plot of the intensity of radiation transmitted through the reticle of FIGS. 3a and 3b.

FIG. 3c illustrates a profile of the intensity of radiation, at the surface of a semiconductor substrate, after the radiation is transmitted through reticle 300. Chrome layer 350 blocks incident radiation from the semiconductor surface. Phase regions 311, 312 and 313 transmit the incident radiation. The intensity of radiation transmitted by each phase region has a magnitude of approximately 1, however the intensity drops to approximately 0 in regions 323 and 324, which correspond to edges 315 and 316. Edges 315 and 314 are located between phase regions 311 and 312 and between phase regions 312 and 313, respectively. The sharp drop in intensity in regions 323 and 324 is due to the destructive interference of radiation that occurs between the phase regions. Due to the close proximity of edges 315 and 316 to one another, two device features are created with smaller CDs. Thus when a photosensitive material is exposed to radiation through reticle 300, a portion of the material beneath edges 315 and 316 will be substantially unexposed, while portions of the material beneath regions 311 and 313 will be substantially exposed. Thus when, for example, a positive photoresist is exposed and developed using reticle 300, an ultrafine strip of photoresist 331 will remain beneath edges 315 and 316, as illustrated in FIGS. 3d.

Figure 3D:
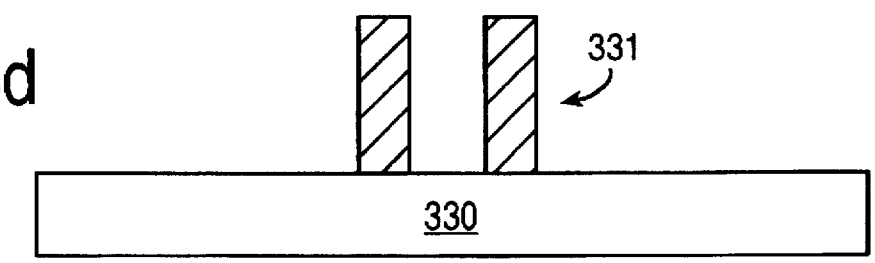
FIG. 3d illustrates a cross-section of a semiconductor substrate including a proximity-of-edges feature.
Figure 3E:
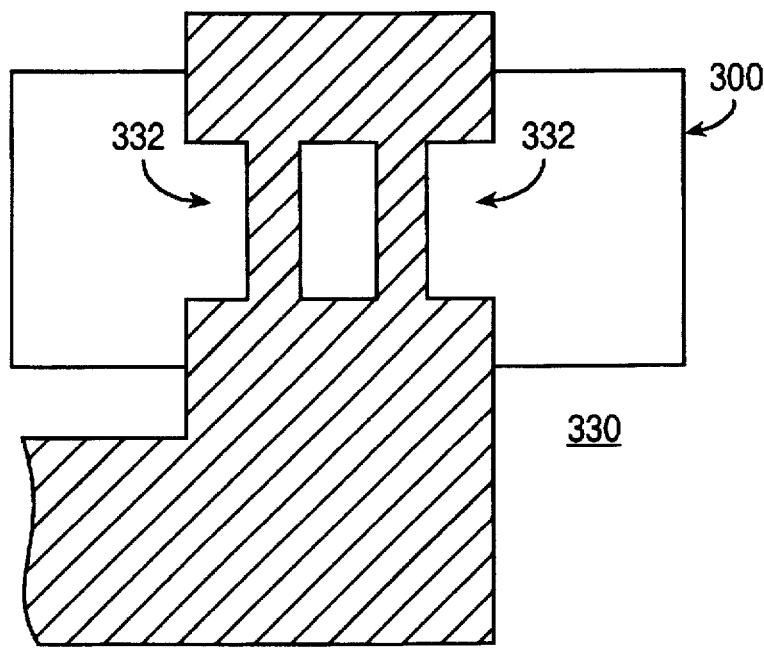
FIG. 3e illustrates a top view of the semiconductor substrate in FIG. 3d wherein a gate feature has been patterned using one embodiment of the proximity-of-edges method.

FIG. 3d illustrates a cross-sectional view of a semiconductor substrate 330 with patterned photoresist 331. FIG. 3e illustrates a top view of a patterned gate layer (gate electrode) 332. Gate electrode 332 has been patterned using reticle 300, the outline of which is also illustrated in FIG. 3e. The critical dimensions of gate electrode 332 may be varied using the proximity-of-edges method by changing the distance between the edges 315 and 316. Because of the relatively close proximity of the edges the dark regions (i.e. regions 323 and 324) form two device features with smaller critical dimensions. It should be noted and it will be obvious to one with ordinary skill in the art, that the reticle illustrated in FIG. 3a is only a single example and that other reticle layouts may be used to create various device features in various paterns/layouts.

It should be noted that the distance between the edges 315 and 316 to obtain the desired critical dimensions depends upon the type of stepper used and the numerical aperture (NA) of that stepper. For example, i-line (λ~365 nm), g-line (λ~436 nm), and DUV (λ~248 nm) steppers may be used. One with ordinary skill in the art will appreciate that the resolution of a stepper is equal to $$K_1 \frac{\lambda}{NA}$$

where $K_1$ is a constant, λ is the wavelength of the stepper, and NA is the numerical aperture of the stepper. In one embodiment of the present invention a DUV stepper with NA=5 is used and is described with respect to FIG. 3f below.

Figure 3F:
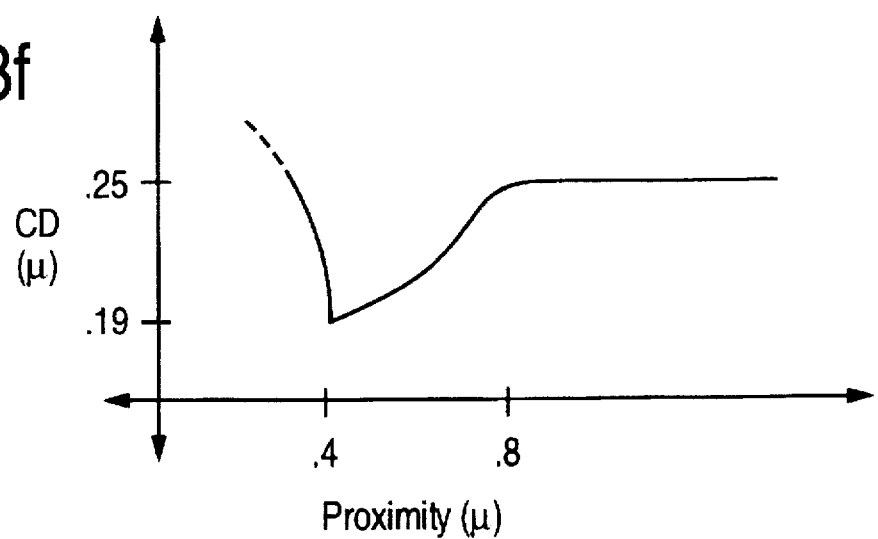
FIG. 3f illustrates a graph of critical dimensions (CDs) of a device feature versus the proximity of the edges of the mask used to create that device feature.

FIG. 3f illustrates a graphical illustration of the CD versus the proximity of the edges for one embodiment of the present invention where NA=5. Note that the closer the proximity of the edges the smaller the CD that may be achieved. For example, for CDs in the range of approximately 0.2 and 0.25μ, the proximity of the edges should fall within the range of approximately 0.4 to 0.8μ. It will be appreciated by one with ordinary skill in the art that a distance greater than approximately 0.8μ or less than approximately 0.4μ will give the same results as that of a single-edge phase-edge technique. In other words, if the distance between edges 315 and 316 is greater than 0.8μ or less than 0.4μ, the edges will act independently and form two device layers separated from each other with larger CDs, rather than two device layers with smaller CDs as is desired. Thus, by adjusting the distance between the phase edges 315 and 316, ultrafine device features with varying critical dimensions may be fabricated using the proximity-of-edges method. It should be noted and it will be obvious to one with ordinary skill in the art that if a stepper with a smaller NA is used, then the distance between the edges may increase while still fabricating devices with ultrafine features. For example, if NA=6, then the distance between edges 315 and 316 may be in the range of approximately 0.5–0.9μ.

Another method for varying the CD of the device layer, for example, a gate electrode, is referred to herein as the "phase-edge with chrome and adjustable partial coherence" or "adjusted partial coherence" method. The adjusted partial coherence method is an improvement upon the phase-edge with chrome technique. As described in the background of the invention. above, the prior art phase-edge with chrome technique is unable to pattern device layers with small critical dimensions due to the inability of current fabrication processes to form a small enough chrome strip that will provide such submicron dimensions with any accuracy. The adjusted partial coherence method enables the use of chrome strips that are sized to dimensions that current fabrication processes can form, but controls the critical dimensions of the photoresist and gate electrode by adjusting the partial coherence of the stepper used to radiate the reticle.

Figure 4A:
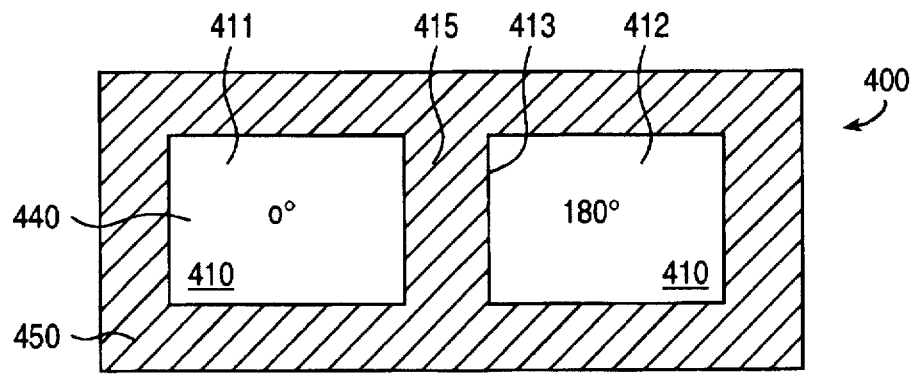
FIG. 4a illustrates a top view of a reticle used in one preferred embodiment of the adjusted partial coherence method.

FIG. 4a illustrates a top view of reticle 400 having two layers, a first (or bottom) layer 440 which is made of a transparent material, for example quartz, and a second (or top) reticle layer 450 which is made of an opaque material, for example chrome (chromium oxide). Diffusion region 410 is the exposed area of quartz layer 440 (i.e. is not covered by chrome layer 450) and is divided into a first phase region 411 and a second phase region 412. First phase region 411 has a first phase and second phase region 412 has a second phase. In one currently preferred embodiment the difference between the first phase and the second phase is approximately 180° (for a further explanation of phase difference see the discussion with respect to phase regions 311,312, and 313, described above). Reticle 400 also includes a chrome strip 415 which is positioned at the transition from first phase region 411 to second phase region 412 (i.e. at phase-edge 413). The width of chrome strip 415, along with the adjusted partial coherence of the stepper, helps to vary the critical dimensions of the device layer being patterned. In particular, chrome strip 415 and adjusted partial coherence values enable the patterning of devices with dimensions ≦0.25μ.

Figure 4B:
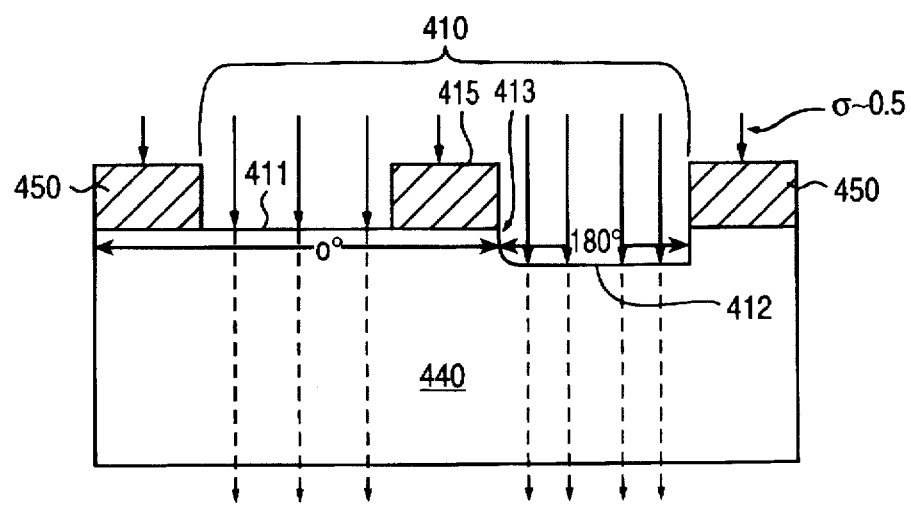
FIG. 4b illustrates a cross-sectional view of the reticle shown in FIG. 4a as used in one preferred embodiment of the adjusted partial coherence method.

A cross-sectional view of reticle 400 is shown in FIG. 4b during exposure to radiation with a partial coherence value (σ) of approximately 0.5 (σ~0.5). Prior art processes use partial coherence values of approximately 0.6 and above. However, as described above in the background of the invention, such partial coherence values along with the use of a chrome strip are unable to control critical dimensions of ≦0.25μ. The adjusted partial coherence method adjusts the partial coherence value of the stepper to enable the use of chrome strips 415 to fabricate device layers with CDs ≦0.25μ. It should be noted and it will be obvious to one with ordinary skill in the art, that the partial coherence value will be adjusted based upon the width of the chrome strip 415 and upon the desired critical dimension. In other words, smaller partial coherence values may be used for wider chrome strips in order to fabricate device layers with small CDs. For example, a partial coherence value of approximately 0.3 may be used with a wide chrome strip to fabricate a device layer with a CD of approximately 0.25μ. However, a partial coherence value of approximately 0.4 may be used with a relatively thinner chrome strip to fabricate the same device layer.

Figure 4C:
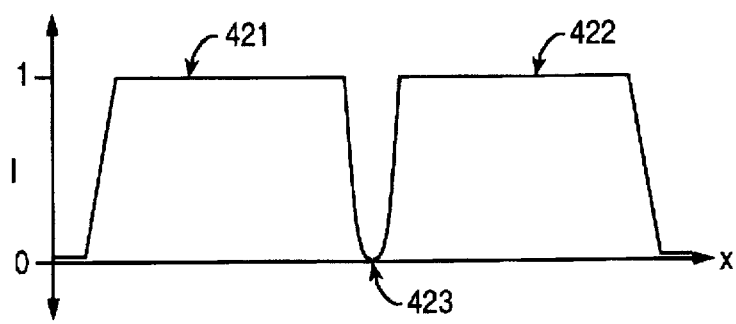
FIG. 4c is a plot of the intensity of radiation transmitted through the reticle of FIGS. 4a and 4b.

FIG. 4c illustrates a profile of the intensity of radiation, at the surface of a semiconductor substrate, after the radiation with a partial coherence value of approximately 0.5 is transmitted through reticle 400. Chrome layer 450 blocks incident radiation from the semiconductor surface. Phase regions 411 and 412 transmit the incident radiation. The intensity of radiation transmitted by each phase region has a magnitude of approximately 1, however the intensity drops to approximately 0 in region 423, which corresponds to edge 413 and chrome strip 415. The sharp drop in intensity in region 423 is due to the destructive interference of radiation that occurs between the phase regions and the blocking of incident radiation by chrome strip 415. However, because of the change in partial coherence value of the stepper, the drop in intensity in region 423 is not as broad as the drop in intensity would be using a similar reticle and stepper with a higher partial coherence value. For example, compare region 423 of the adjusted partial coherence technique to region 223 of the phase-edge with chrome technique previously described in the background of the invention. Due to a lower partial coherence value region 423 is not as broad as region 223. Thus, when a photosensitive material is exposed to radiation through reticle 400, a portion of the material beneath edge 413 and chrome strip 415 will be substantially unexposed, while portions of the material beneath regions 411 and 412 without chrome strip 415 will be substantially exposed. Thus when, for example, a positive photoresist is exposed and developed using reticle 400, an ultrafine strip of photoresist 431 will remain, as illustrated in FIGS. 4d and 4e.

Figure 4D:
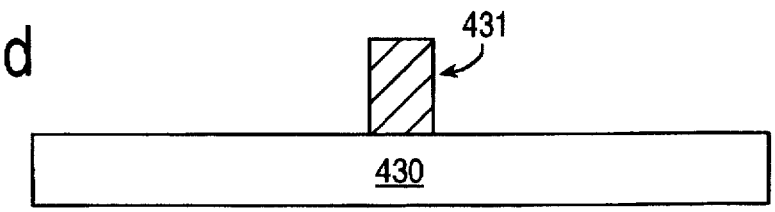
FIG. 4d illustrates a cross-section of a semiconductor substrate including an adjusted partial coherence feature.
Figure 4E:
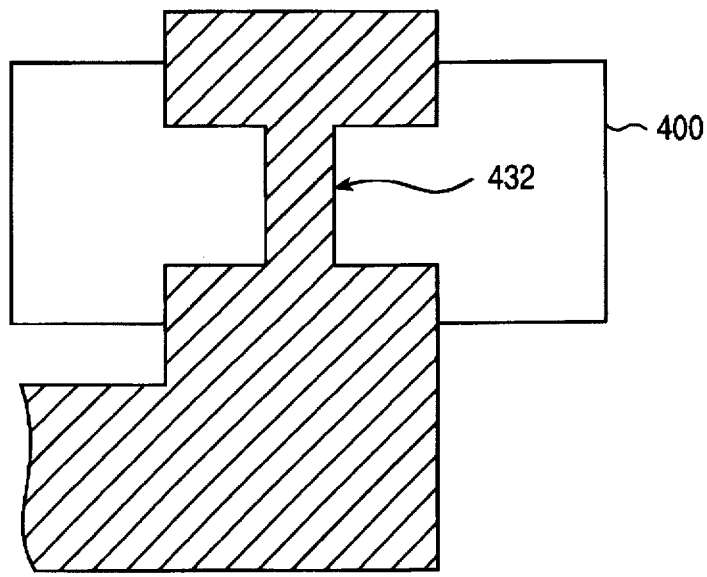
FIG. 4e illustrates a top view of the semiconductor substrate in FIG. 4d wherein a gate feature has been patterned using one embodiment of the adjusted partial coherence method.

FIG. 4d illustrates a cross-sectional view of a semiconductor substrate 430 with patterned photoresist 431. FIG. 4e illustrates a top view of a patterned gate layer (gate electrode) 432. Gate electrode 432 has been patterned using reticle 400, the outline of which is also illustrated in FIG. 4e. The critical dimensions of gate electrode 432 may be varied using the adjusted partial coherence method by changing the partial coherence value and/or the width of chrome strip 415. Because of the use of a lower partial coherence value device features may be patterned with dimensions ≦0.25μ.

Figure 4F:
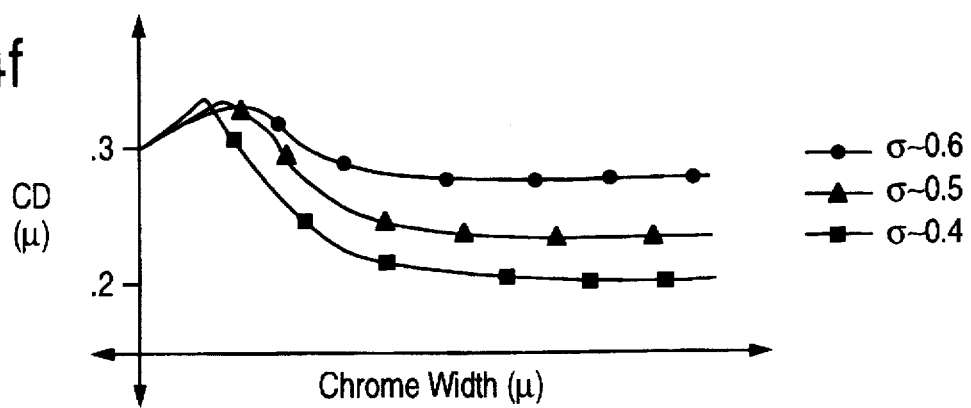
FIG. 4f illustrates a graph of critical dimensions (CDs) of a device feature versus the width of a chrome strip on the mask used to create that device feature at varying partial coherence values.

FIG. 4f illustrates a graphical illustration of the CD versus the width of chrome strip 415 for varying partial coherence values. Note that the lower partial coherence value the smaller the CD that may be achieved. Thus, by adjusting the partial coherence value of the stepper and altering the width of the chrome strip 415 ultrafine device features with varying critical dimensions may be fabricated using the adjusted partial coherence method.

Thus, a new process and an improved process for fabricating device layers with ultrafine features have been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for fabricating a device layer with ultrafine features comprising:

depositing a first device layer to be patterned above a substrate;

depositing a photoresist layer above said first device layer;

providing a reticle, said reticle having a first reticle layer, said first reticle layer having a first phase region and a second phase region, said first phase region having a first phase and said second phase region having a second phase, wherein said first and second phases indicate an mount by which incident radiation is shifted through said reticle; said reticle having a second reticle layer, said second reticle layer disposed above said first reticle layer proximate to the location wherein said first phase region transitions to said second phase region of said first reticle layer;

exposing said photoresist layer to radiation through said reticle using a stepper; and adjusting the partial coherence of said stepper, wherein said step of adjusting the partial coherence of said stepper controls the critical dimensions of said device layer being fabricated.

2. The method as described in claim 1 wherein said device layer being fabricated is a gate electrode and said first device layer to be patterned comprises polysilicon.

3. The method as described in claim 1 wherein said first reticle layer comprises quartz.

4. The method as described in claim 1 wherein said second reticle layer comprises chromium oxide.

5. The method as described in claim 1 wherein the difference between said first phase and said second phase is approximately 180°.

6. The method as described in claim 1 wherein the partial coherence of said stepper is adjusted to less than 0.6 to achieve smaller critical dimensions.

7. A method for fabricating a device layer with ultrafine features comprising:

depositing a first device layer to be patterned above a substrate;

depositing a photoresist layer above said first device layer;

providing a reticle, said reticle having a first reticle layer, said first reticle layer having a first phase region, a second phase region, and a third phase region, wherein said second phase region is disposed between said first and third phase regions, said first and third phase regions having a first phase and said second phase region having a second phase, wherein said first and second phases indicate an amount by which incident radiation is shifted through said reticle, and wherein the boundaries between said first phase region and said second phase region form a first phase-edge and the boundaries between said second phase region and said third phase region form a second phase edge; and exposing said photoresist layer to radiation through said reticle using a stepper, wherein the critical dimensions of said device layer being fabricated are controlled by adjusting the distance between said first phase-edge and said second phase edge.

8. The method as described in claim 7 wherein said device layer being fabricated is a gate electrode and said first device layer to be patterned comprises polysilicon.

9. The method as described in claim 7 wherein said first reticle layer comprises quartz.

10. The method as described in claim 7 wherein the difference between said first phase and said second phase is approximately 180°.

11. The method as described in claim 7 wherein the distance between said first phase-edge and said second phase-edge is determined by the resolution of the stepper.

12. The method as described in claim 7 wherein said reticle further comprises a second reticle layer, said second reticle layer disposed above said first reticle layer proximate to the location wherein said first phase region transitions to said second phase region of said first reticle layer and above said first reticle layer proximate to the location wherein said third phase region transitions to said second phase region.

13. The method as described in claim 12, wherein said second reticle layer is used to enlarge said critical dimensions of said device layer when during said exposure step the partial coherence of said stepper is approximately 0.6 and decrease the critical dimensions of said device layer being fabricated when during said exposure step the partial coherence of said stepper is adjusted to less than 0.6.

14. The method as described in claim 12 wherein said second reticle layer comprises chromium oxide.

15. The method as described in claim 12, wherein said second reticle layer is used to enlarge said critical dimensions of said device layer when during said exposure step the partial coherence of said stepper is approximately 0.6.

16. The method as described in claim 12, wherein said second reticle layer is used to decrease the critical dimensions of said device layer being fabricated when during said exposure step the partial coherence of said stepper is adjusted to less than 0.6.

17. A method for fabricating a device layer with ultrafine features comprising:

depositing a first device layer to be patterned above a substrate;

depositing a photoresist layer above said first device layer;

providing a reticle, said reticle having a first reticle layer, said first reticle layer having a first phase region and a second phase region, said first phase region having a first phase and said second phase region having a second phase, wherein said first and second phases indicate an amount by which incident radiation is shifted through said reticle; said reticle having a second reticle layer, said second reticle layer disposed above said first reticle layer proximate to the location wherein said first phase region transitions to said second phase region of said first reticle layer;

exposing said photoresist layer to radiation through said reticle using a stepper;

adjusting the partial coherence of said stepper, wherein said step of adjusting the partial coherence of said stepper controls the critical dimensions of said device layer being fabricated, and wherein the critical dimensions of said device layer being fabricated are decreased when the partial coherence of said stepper is adjusted to less than 0.6.

18. The method as described in claim 17 wherein said device layer being fabricated is a gate electrode and said first device layer to be patterned comprises polysilicon.

19. The method as described in claim 17 wherein said first reticle layer comprises quartz.

20. The method as described in claim 17 wherein said second reticle layer comprises chromium oxide.

21. The method as described in claim 17 wherein the difference between said first phase and said second phase is approximately 180°.

* * * * *

UNITED STATES PATENT AND TRADEMARK OFFICE
CERTIFICATE OF CORRECTION

PATENT NO. : 5,688,409
DATED : November 18, 1997
INVENTOR(S) : Dao et al.

It is certified that error appears in the above-indentified patent and that said Letters Patent is hereby corrected as shown below:

In column 8 at line 58 delete "mount" and insert --amount--

Signed and Sealed this

Seventh Day of July, 1998

Attest:

BRUCE LEHMAN

Attesting Officer

Commissioner of Patents and Trademarks